United States Patent
Menkara et al.

(10) Patent No.: US 6,987,353 B2
(45) Date of Patent: Jan. 17, 2006

(54) LIGHT EMITTING DEVICE HAVING SULFOSELENIDE FLUORESCENT PHOSPHOR

(75) Inventors: Hisham Menkara, Mableton, GA (US); Christopher Summers, Atlanta, GA (US)

(73) Assignee: Phosphortech Corporation, Alpharetta, GA (US)

( * ) Notice: Subject to any disclaimer, the term of this patent is extended or adjusted under 35 U.S.C. 154(b) by 161 days.

(21) Appl. No.: 10/661,931

(22) Filed: Sep. 15, 2003

(65) Prior Publication Data
US 2005/0023962 A1    Feb. 3, 2005

Related U.S. Application Data

(60) Provisional application No. 60/492,008, filed on Aug. 2, 2003.

(51) Int. Cl.
*H01B 33/20* (2006.01)
(52) U.S. Cl. ............ 313/503; 313/502; 252/301.6 S
(58) Field of Classification Search .......... 313/495, 313/498, 502, 503; 252/301.6 S
See application file for complete search history.

(56) References Cited

U.S. PATENT DOCUMENTS

| | | | |
|---|---|---|---|
| 2,742,376 A * | 4/1956 | Larach ............... | 427/64 |
| 4,263,339 A * | 4/1981 | Fischer ............... | 427/64 |
| 4,512,911 A | 4/1985 | Kotera et al. ......... | 252/301.4 H |
| 4,661,419 A | 4/1987 | Nakamura ............. | 428/691 |
| 5,140,604 A | 8/1992 | Alablanche et al. ..... | 372/41 |
| 5,198,679 A | 3/1993 | Katoh et al. .......... | 250/484.4 |
| 5,602,445 A | 2/1997 | Solanki et al. ........ | 313/503 |
| 5,648,181 A | 7/1997 | Watanabe ............. | 428/689 |
| 5,698,857 A | 12/1997 | Lambert et al. ....... | 250/483.1 |
| 5,998,925 A | 12/1999 | Shimizu et al. ........ | 313/503 |
| 6,006,582 A | 12/1999 | Bhandari et al. ...... | 73/23.2 |
| 6,066,861 A | 5/2000 | Hohn et al. ............ | 257/99 |
| 6,153,971 A | 11/2000 | Shimizu et al. ........ | 313/486 |
| 6,255,670 B1 | 7/2001 | Srivastava et al. ..... | 257/89 |
| 6,509,651 B1 * | 1/2003 | Matsubara et al. ..... | 257/461 |
| 2004/0056256 A1 * | 3/2004 | Bokor et al. .......... | 257/79 |

* cited by examiner

*Primary Examiner*—Nimeshkumar D. Patel
*Assistant Examiner*—Matt Hodges
(74) *Attorney, Agent, or Firm*—Christopher Whewell

(57) ABSTRACT

Provided herein are novel phosphors useful in the manufacture of white light emitting diodes. The phosphors provided by the invention are described by the formula: described by the formula:

$$ZnS_xSe_y:Cu,A$$

in which x and y are each independently any value between 0 and about 1, subject to the proviso that the sum of x and y is equal to any number in the range of between about 0.75 and about 1.25; wherein A is optional and comprises at least one additional element selected from the group consisting of: Ag, Al, Ce, Tb, Cl, I, Mg, and Mn, including mixtures thereof, and wherein Cu is present in any amount between about 0.0001% and about 5% in mole percent based on the total molar weight of said composition.

Standard techniques used in phosphor deposition for the manufacture of light emitting diodes which comprise phosphors may be employed to produce LED's having a white light output when the phosphors of the invention are utilized.

6 Claims, 5 Drawing Sheets

(a)

(b)

(c)

● Light-emitting surface
⊙ Phosphor particles
○ Epoxy encapsulation

Leadframe-mounted LEDs

Surface-mounted LEDs

LIGHT EMITTING DEVICE HAVING SULFOSELENIDE FLUORESCENT PHOSPHOR

CROSS-REFERENCE TO RELATED APPLICATIONS

This application claims the benefit of U.S. Provisional Application Ser. No. 60/492,008, filed Aug. 2, 2003, which application is incorporated herein by reference in its entirety.

STATEMENT AS TO FEDERALLY-SPONSORED RESEARCH

This invention was made, at least in part, with a government grant from the National Science Foundation (Grant No. 6108576). The U.S. government may have certain rights in this invention.

TECHNICAL FIELD

The present invention relates generally to solid-state light-emitting devices. More particularly, it relates to light emitting diodes and the like which comprise improved solid state materials having enhanced performance and efficiency over similar devices of the prior art.

BACKGROUND INFORMATION

There have been few major improvements in conventional lighting (i.e. incandescent, halogen, and fluorescent lamps) over the past 20 years. However, in the case of light emitting diodes ("LEDs"), operating efficiencies have been improved to the point where they are replacing incandescent and halogen lamps in traditional mono-chrome lighting applications, such as traffic lights and automotive taillights. This is due in part to the fact that LEDs have many advantages over conventional light sources that include long life, ruggedness, low power consumption, and small size. LEDs are monochromatic light sources, and are currently available in various colors from UV-blue to green, yellow, and red. Furthermore, due to LEDs' narrow-band emission characteristics, a white color LED can only be produced by: 1) arranging individual red, green, and blue (R, G, B) LEDs closely together and then diffusing and mixing the light emitted by them; or 2) combining a short-wave UV or blue LED with broadband fluorescent compounds that convert part or all of the LED light into longer wavelengths.

When creating a white LED using the first approach described above, several problems arise due to the fact that the R, G, B light emitting devices are made of different semiconductor materials, which require different operating voltages and, therefore, complex driving circuitry. Another disadvantage arises from the low color-rendering characteristic of the resulting white light due to the monochromatic nature of the R, G, B LED emissions.

The second approach for producing white light from LEDs is in general more preferred, since it only requires a single type of LED (either UV or blue) coated with one or more fluorescent materials, thereby making the overall construct of a white light producing LED more compact, simpler in construction, and lower in cost versus the former alternative. Furthermore, the broadband light emission provided by most fluorescent materials or phosphors allows the possibility of high color-rendering white light.

A recent breakthrough in the efficiency of UV/blue LEDs has resulted in phosphor-coated blue LEDs becoming a serious contender for conventional incandescent bulbs used in the current illumination and display backlighting applications. Most of the current commercially-available devices work by converting a portion of the blue LED emission to yellow. In such a situation, some of the blue light from the LED is transmitted through the phosphor and mixed with the yellow phosphor emission, thereby resulting in a perceived white light. Many workers have delved in the field of phosphors as evidenced by the following US patents, which are expressly incorporated by reference.

U.S. Pat. No. 4,512,911 discloses a rare earth element activated complex halide phosphor represented by the formula:

$$BaF_2.aBaX_2.bMgF_2.cBeF_2.dMe''F_2:eLn$$

wherein X is at least one halogen selected from the group consisting of chlorine, bromine and iodine; $Me''$ is at least one divalent metal selected from the group consisting of: calcium and strontium; Ln is at least one rare earth element selected from the group consisting of: divalent europium ($Eu^{2+}$), cerium ($Ce^{3+}$) and terbium ($Tb^{3+}$), and a is in the range between 0.90 and 1.05, b is in the range of 0 to 1.2; c is in the range of between 0 and 1.2, and d is defined by the sum of c+d being in the range of between 0 and 1.2, and $BeF_2$ is present in an amount sufficient to effect a phosphor exhibiting a higher luminance than said phosphor absent $BeF_2$ when stimulated by light of a wavelength ranging from 450 to 800 nm after exposure to X-rays.

U.S. Pat. No. 4,661,419 teaches a cerium activated rare earth halophosphate phosphor having the formula:

$$LnPO_4.aLnX_3:xCe^{3+}$$

in which Ln is at least one rare earth element selected from the group consisting of Y, La, Gd and Lu; X is at least one halogen selected from the group consisting of F, Cl, Br and I; and a and x are numbers satisfying the conditions of $0.1<a<10.0$ and $0<x<0.2$, respectively and exhibiting a higher stimulated emission upon excitation with a He—Ne laser of a wavelength 632.8 nm after exposure to X-rays at 80 KVp, than the phosphor wherein a is less than 0.1.

U.S. Pat. No. 5,140,604 provides mixed single-phase strontium and lanthanide oxide with a magnetolead type crystalline structure having the formula (I):

$$Sr_xLn1_{y1}Ln2_{y2}Ln3_{y3}M_zA_aB_bO_{19-k} \quad (I)$$

in which Ln1 represents at least one trivalent element selected from lanthanum, gadolinium and yttrium; Ln2 represents at least one trivalent element selected from neodymium, praseodymium, erbium, holmium and thulium; Ln3 represents an element selected from bivalent europium or trivalent cerium with retention of electric neutrality by virtue of oxygen holes; M represents at least one bivalent metal selected from magnesium, manganese, and zinc; A represents at least one trivalent metal selected from aluminium and gallium; B represents at least one trivalent transition metal selected from chromium and titanium; x, y1, y2, y3, z, a, b and k represent numbers so that $0<x<1$, $0<y1<1$, $0<y2<1$, $0<y3<1$, $0<z<1$, $10.5<a<12$, $0<b<0.5$ and $0<k<1$ provided that $0<x+y1+y2+y3<1$ and that $11<z+a+b<12$.

U.S. Pat. No. 5,198,679 teaches a divalent europium activated alkaline earth metal halide phosphor having the formula:

$$M''X_2.aM''X'_2.bSiO:xEu^{2+}$$

in which $M''$ is at least one alkaline earth metal selected from the group consisting of Ba, Sr and Ca; each of X and X' is at least one halogen selected from the group consisting of Cl, Br and I, and X is not the same as X'; a and x are numbers satisfying the conditions of 0.1<a<10.0 and 0<x<0.2, respectively; and b is a number satisfying the condition of $0<b<3\times10^{-2}$. Two halogens are present in this composition, whereas your proposed composition only contains one halogen, fluorine.

U.S. Pat. No. 5,602,445 teaches a bright, short wavelength blue-violet phosphor for electro luminescent displays comprises an alkaline-based halide as a host material and a rare earth as a dopant. The host alkaline chloride can be chosen from the group II alkaline elements, particularly $SrCl_2$ or $CaCl_2$, which, with a europium or cerium rare earth dopant, electroluminesces at a peak wavelength of 404 and 367 nanometers respectively. The resulting emissions have CIE chromaticity coordinates which lie at the boundary of the visible range for the human eye thereby allowing a greater range of colors for full color flat panel electroluminescent displays.

U.S. Pat. No. 5,648,181 describes an inorganic thin film electroluminescent device, comprising an inorganic light emission layer, a pair of electrodes and a pair of insulating layers, at least one of the electrodes being optically transparent, the light emission layer being positioned between the pair of insulating layers, each insulating layer being formed on an opposite side of the light emission layer, the pair of insulating layers being positioned between a light emission layer and the pair of electrodes, the light emission layer consisting essentially of inorganic material comprising a matrix of lanthanum fluoride doped with at least one member selected from the group consisting of: rare earth element metals and compounds thereof.

U.S. Pat. No. 5,698,857 teaches a radiographic phosphor screen comprising a support and, coated on the support, at least one layer forming a luminescent portion and an overcoat layer, the luminescent portion and overcoat layer including a binder that is transparent to X-radiation and emitted light and said luminescent portion including phosphor particles in a weight ratio of phosphor particles to binder of 7:1 to 25:1. The phosphor comprises oxygen and a combination of species characterized by the relationship:

$$(Ba_{1-q}M_q)(Hf_{1-z-e}Zr_zMg_e):yT$$

wherein M is selected from the group consisting of Ca and Sr and combinations thereof; T is Cu; q is from 0 to 0.15; z is from 0 to 1; e is from 0 to 0.10; z+e is from 0 to 1; and y is from $1\times10^{-6}$ to 0.02.

U.S. Pat. No. 5,998,925 provides a light-emitting device, comprising a light emitting component and a phosphor capable of absorbing a part of light emitted by the light emitting component and emitting light of wavelength different from that of the absorbed light; wherein the light-emitting component comprises a nitride compound semiconductor represented by the formula: $In_i\ Ga_j\ Al_k\ N$ where 0<i, 0<j, 0<k and i+j+k=1 and the phosphor contains a garnet fluorescent material comprising: 1) at least one element selected from the group consisting of Y, Lu, Se, La, Gd and Sm; and 2) at least one element selected from the group consisting of Al, Ga and In, and being activated with cerium. One inorganic phosphor used in commercial white LEDs is the cerium-doped yttrium aluminum garnet $Y_3Al_5O_{12}$:Ce (YAG:Ce) and its derivative phosphors described in this patent, which is regarded by many in the field as being the standard inorganic phosphor used in commercial white LEDs as of this writing.

U.S. Pat. No. 6,006,582 sets forth a hydrogen sensor for the detection of hydrogen gas in a gaseous environment susceptible to the incursion or generation of hydrogen, said sensor comprising: (i) a rare earth metal thin film, consisting essentially of one or more metals selected from the group consisting of scandium, yttrium, lanthanum cerium, praseodymium, neodymium, promethium, samarium, europium, gadolinium, terbium, dysprosium, holmium, erbium, thulium, ytterbium, lutetium, actinium, thorium, protactinium, uranium, neptunium, plutonium, americium, curium, berkelium, californium, einsteinium, fermium, mendelevium, nobelium, lawrencium, and alloys thereof with one or more of magnesium, calcium, barium, strontium, cobalt and iridium, with the rare earth metal thin film exhibiting a detectable change of physical property when the rare earth metal thin film is exposed to hydrogen gas in a gaseous environment, wherein the rare earth metal thin film is arranged for exposure to the gaseous environment susceptible to the incursion or generation of hydrogen; and (ii) means for exhibiting the detectable change of physical property when the rare earth metal thin film is exposed to hydrogen in said gaseous environment, said means including circuitry for signal processing the change of physical property and generating an output indicative of hydrogen gas, and wherein the sensor does not comprise a source of hydrogen arranged for selectively switching the rare earth metal thin film between respective switched states.

U.S. Pat. No. 6,066,861 teaches a wavelength-converting casting composition, for converting a wavelength of ultraviolet, blue or green light emitted by an electroluminescent component, comprising: a) a transparent epoxy casting resin; b) an inorganic luminous substance pigment powder dispersed in the transparent epoxy resin, the pigment powder comprising luminous substance pigments from a phosphorus group having the general formula:

$$A_3B_5X_{12}:M,$$

where A is an element selected from the group consisting of Y, Ca, Sr; B is an element selected from the group consisting of Al, Ga, Si; X is an element selected from the group consisting of O and S; and M is an element selected from the group consisting of Ce and Tb. The luminous substance pigments have grain sizes <20 $\mu$m and a mean grain diameter $d_{50}$<5 $\mu$m.

U.S. Pat. No. 6,153,971 describes a method for illuminating an object that allows categorical color perception of at least red, green, blue, yellow and white on the surface of the illuminated object, the method comprising: illuminating the object with light consisting essentially of the combination of light of two major wavelength bands, in which: the first wavelength band is from 530 to 580 nm; and the second wavelength band is from 600 to 650 nm.

U.S. Pat. No. 6,255,670 teaches a composition of matter comprising $Ba_2(Mg,Zn)Si_2\ O_7:Eu^{2+}$, as well as a composition of matter comprising: $(Ba_{1-X-Y-Z},Ca_X,Sr_Y,Eu_Z)_2$ $(Mg_{1-W},Zn_W)\ Si_2O_7$, wherein X+Y+Z=1; Z>0; and 0.05<W<0.50.

BRIEF SUMMARY OF THE INVENTION

The present invention provides a sulfide- and/or selenide-based fluorescent material which is capable of absorbing with high efficiency either blue, violet, or ultraviolet (UV)

light emitted by an LED, and emitting light of a wavelength longer from that absorbed from the LED. The phosphor materials provided by the present invention can be manufactured to emit broad color spectra that can be continuously tuned from green to yellow and red emissions. By combining the materials of the present invention with a blue or violet LED, it is also possible to produce white light using a single component phosphor without the need of a complex red, green, and blue (RGB) phosphor system and a UV LED as proposed by U.S. Pat. No. 6,255,670.

The phosphor component of a light-emitting device made using the phosphors provided by the present invention may be made using either a single phosphor component or a compatible mix of different phosphors derived from the above formula in order to achieve a specific, desired white color performance.

Thus, the present invention in one of its preferred forms provides a composition of matter useful as a phosphor in light emitting diodes, which comprises a material described by the formula:

$$ZnS_xSe_y:Cu,A$$

in which x and y are each independently any value between 0 and 1 and A is at least one of Ag, Al, Ce, Tb, Cl, I, Mg, Mn. According to one form of the invention, monovalent Cu, which serves as the main activator, is present in any amount between 0.0001% and about 5% in mole percent based on the total molar weight of said composition. Thus, the activator, Cu, may be present in any amount between 0.0001% and 5.00% in mole percent based on the total molar weight of the composition, including every thousandth percentage therebetween. According to an alternative form of the invention, $0.5 \leq x \leq 1$ and $0 \leq y \leq 0.5$ in the above formula. According to another alternative form of the invention, $x=1$ and $y=0$ in the above formula. According to another alternative form of the invention, $0 \leq x \leq 0.5$ and $0 \leq y \leq 0.5$ in the above formula. According to another alternative form of the invention, $x=0$ and $y=1$ in the above formula. According to another alternative form of the invention, $0 \leq x \leq 0.5$ and $0.5 \leq y \leq 1.0$ in the above formula. According to another alternative form of the invention, $x=0.75$ and $y=0.25$ in the above formula.

The invention also provides a composition of matter useful as a phosphor material in light emitting diodes, which composition comprises a material described by the formula:

$$ZnS_xSe_y:Cu,A$$

in which x, and y are each independently any value between 0 and 1, including 0 and 1; and wherein A, which serves as one or several optional co-activator(s), comprises one or more elements selected from the group consisting of: Ag, Al, Ce, Tb, Cl, I, Mg, Mn, including mixtures comprising any two, any three, any four, any five, any six, any seven, or more of these elements in any proportion, and wherein copper and A may each independently be present in any amount between 0.0001% and about 5% in mole percent based on the total molar weight of said composition. Thus, the co-activator(s), A, may be present in any amount between 0.0001% and 5.00% in mole percent based on the total molar weight of the composition, including every thousandth percentage therebetween. According to an alternative form of the invention, $0.5 \leq x \leq 1.0$ and $0 \leq y \leq 0.5$ in the above formula with the co-activator(s) present. According to another alternative form of the invention, $x=1$ and $y=0$ in the above formula with the co-activator present. According to another alternative form of the invention, $0 \leq x \leq 0.5$ and $0 \leq y \leq 0.5$ in the above formula with the co-activator(s) present. According to another alternative form of the invention, $x=0$ and $y=1$ in the above formula with the co-activator(s) present. According to another alternative form of the invention, $0 \leq x \leq 0.5$ and $0.5 \leq y \leq 1.0$ in the above formula with the co-activator(s) present. According to another alternative form of the invention, $x=0.75$ and $y=0.25$ in the above formula with the co-activator(s) present.

The invention also provides a light emitting device comprising a light source selected from the group consisting of: light-emitting diodes and lasers, wherein the light source emits light having a wavelength of between 360 and 480 nanometers; and a phosphor described by the foregoing two formulae, including the defining set of constraints specified for each one, including without limitation those described by formula:

$$ZnS_xSe_y:Cu,A$$

in which x and y are each independently any value between 0 and 1, including 0 and 1, wherein the phosphor is disposed in a location at which it receives light from said light source, wherein the phosphor further comprises at least one additional element denoted A which is selected from the group consisting of: Ag, Al, Ce, Tb, Cl, I, Mg, and Mn, including mixtures of any of the foregoing, in any proportion. According to one form of the invention, the total amount of such additional optional element(s) are present in the phosphor of such light emitting device in any amount between 0.0001% and 5.00% in mole percent based upon the total molar weight of the phosphor. The invention also provides a light emitting device which comprises a phosphor that is a mixture of two different phosphors provided by the invention, or one phosphor provided by the invention mixed with a phosphor of the prior art. In one embodiment, the phosphor mixture causes the light emitting device to emit white light. In another embodiment, a single phosphor according to the present invention causes a blue light emitting device to emit white light.

DETAILED DESCRIPTION

Figure 1:
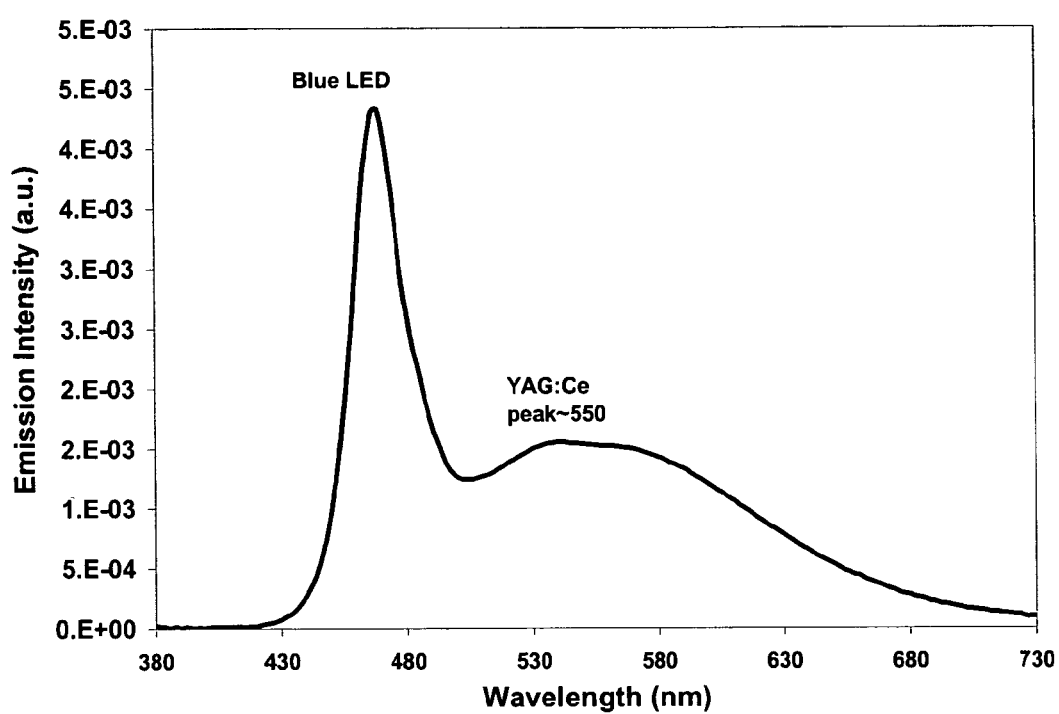
FIG. 1 shows the spectrum of light emitted by a prior art YAG:Ce phosphor.

Referring to the drawings and initially to FIG. 1, there is shown an illustration of the spectrum of light emitted when conventional prior art YAG:Ce phosphors pumped by a blue LED to produce white light. In addition to the YAG:Ce, several types of organic-based fluorescent materials have also been employed, but organic molecules are susceptible to deterioration and accelerated aging when exposed to intense UV or blue light and the high temperatures present near the LED surface. However, with the exception of the YAG:Ce phosphor and its derivatives, there are very few inorganic materials that can efficiently convert blue or violet light to white while maintaining long-term stability. Furthermore, the standard YAG:Ce phosphor used in blue LEDs is deficient in both the blue green and red parts of the spectrum, resulting in low luminous efficiency and color rendering properties.

One of the advantages of using a blue LED with a single-component yellow phosphor instead of a UV LED and an RGB phosphor mix is a more stable color output over time since the latter approach suffers from differential phosphor aging due to the high temperature and light intensity near the LED surface.

Figure 2:
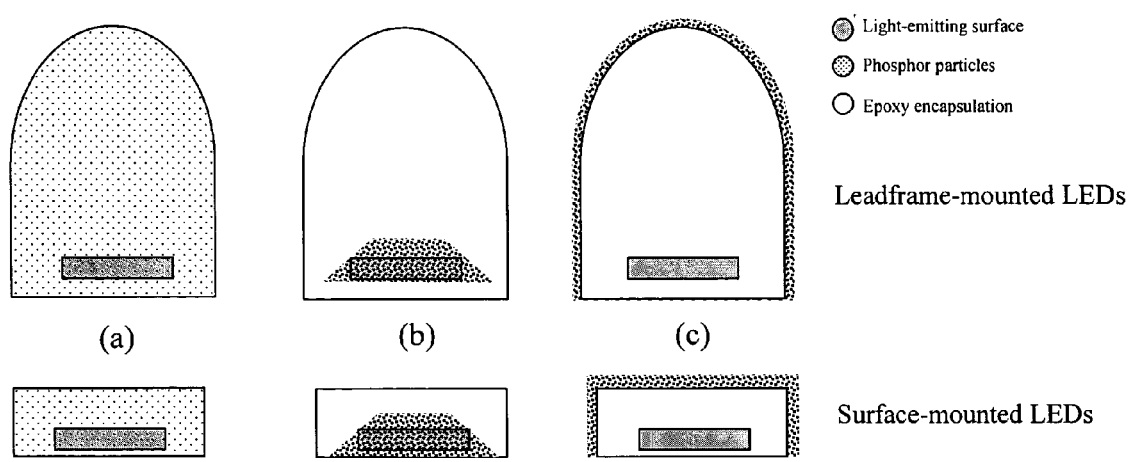
FIG. 2 illustrates some of the known configurations employed to couple the phosphor particles to an LED.

FIGS. 2A, 2B, and 2C illustrate some of the possible configurations used to couple the phosphor particles to an LED, where the phosphor can be either dispersed throughout an epoxy (FIG. 2A) as such dispersion and techniques for its production is known to those skilled in the art, or dispensed directly on the LED light emitting area (FIG. 2B), or on the outside surface of the epoxy (FIG. 2C). The epoxy may encapsulate the LED. The standard commercial technique used in phosphor deposition on LED dies involves blending the phosphor powders in optically clear liquid polymer systems, such as polypropylene, polycarbonate, or polytetrafluoroethylene (PTFE), or, more commonly, epoxy resins, or silicone, as is known to those skilled in the art. The resulting material is subsequently painted or otherwise dispensed on the LED and dried, solidified, or cured. A final layer of epoxy is often subsequently applied to protect the entire assembly or to in some cases act as an optical lens for the purpose of focusing the light emitted from the LED die. Thus, the phosphors provided by the invention are well-suited to being processed and deposited onto substrates using conventional techniques known in the art for producing light emitting devices, such as light emitting diodes.

One embodiment of the present invention provides a light emitting device comprising a UV/blue light emitting diode and one or more phosphors which absorb all or part of the light emitted by the light emitting diode, and which emit light of wavelengths longer from that of the absorbed light. A phosphor provided by the invention which is useful in such regard is described by the formula:

$$ZnS_xSe_y:Cu$$

in which x and y are each independently variable to be any value between about 0 and about 1, including without limitation 0.001 and 1, and every thousandth therebetween. In one embodiment, the sum of x and y is equal to any number between 0.500 and 1.500. According to another embodiment, the sum of x and y is equal to any number between 0.750 and 1.250. According to a preferred form of the invention, Cu is present in any amount between about 0.0001% and about 5% by weight based upon the phosphor's total weight. According to another preferred form of the invention, at least 70% of all of the copper present is present in the monovalent state. According to another preferred form of the invention, at least 90% of all of the copper present is present in the monovalent state. According to another preferred form of the invention, at least 95% of all of the copper present is present in the monovalent state. According to another preferred form of the invention, at least 98% of all of the copper present is present in the monovalent state. It is most preferred that substantially all of the copper present is present in the monovalent state. According to an alternative form of the invention, $0.5 \leq x \leq 1$ and $0 \leq y \leq 0.5$ in the above formula. According to another alternative form, x=1 and y=0 in the above formula. According to another alternative form of the invention, $0 \leq x \leq 0.5$ and $0 \leq y \leq 0.5$ in the above formula. According to another alternative form of the invention, x=0 and y=1 in the above formula. According to another alternative form of the invention, $0 \leq x \leq 0.5$ and $0.5 \leq y \leq 1.0$ in the above formula. According to another alternative form of the invention, x=0.75 and y=0.25 in the above formula.

In yet another preferred form of the invention is provided a phosphor as described by the formula $$ZnS_xSe_y:Cu,A$$

in which x and y are each independently variable to be any value between about 0 and about 1, including without limitation 0.001 and 1, and every thousandth therebetween. In one embodiment, the sum of x and y is equal to any number between 0.500 and 1.500. According to another embodiment, the sum of x and y is equal to any number between 0.750 and 1.250. According to a preferred form of the invention, Cu is present in any amount between about 0.0001% and about 5% by weight based upon the phosphor's total weight. Such a phosphor further may optionally comprise an optional material denoted "A" selected from the group consisting of Ag, Al, Ce, Tb, Cl, I, Mg, and Mn, including mixtures of any two or more of the foregoing, in any proportion, and which optional material is present independently of the amounts of other constituents of said composition in any amount between about 0.0001% and about 5% by weight based on the phosphor's total weight. According to one alternative form of the invention, $0.5 \leq x \leq 1$ and $0 \leq y \leq 0.5$ in the above formula. According to another alternative form of the invention, x=1 and y=0 in the above formula. According to another alternative form of the invention, $0 \leq x \leq 0.5$ and $0 \leq y \leq 0.5$ in the above formula. According to another alternative form of the invention, x=0 and y=1 in the above formula. According to another alternative form of the invention, $0 \leq x \leq 0.5$ and $0.5 \leq y \leq 1.0$ in the above formula. According to another alternative form of the invention, x=0.75 and y=0.25 in the above formula. According to another preferred form of the invention, at least 70% of all of the copper present is present in the monovalent state. According to another preferred form of the invention, at least 90% of all of the copper present is present in the monovalent state. According to another preferred form of the invention, at least 95% of all of the copper present is present in the monovalent state. According to another preferred form of the invention, at least 98% of all of the copper present is present in the monovalent state. It is most preferred that substantially all of the copper present is present in the monovalent state.

The phosphor materials provided by the present invention are preferably synthesized using powdered ZnS and ZnSe as the starting materials. After mixing of the raw materials in the desired molar ratio, a compound containing one or more of the desired other elements selected to be present in the final composition, which are sometimes referred to as "activating element(s)" or "activator(s)" by those skilled in the art, are slurried into the raw material mixture using distilled or de-ionized water and/or a solvent such as isopropyl alcohol, methanol, ethanol, etc. as the slurry vehicle. Activating elements useful to provide a composition according to the present invention include the elements copper, silver, aluminum, cerium, terbium, chlorine, iodine, magnesium, and manganese, and to provide such elements in a final phosphor according to the invention, it is preferable to employ compounds or salts of Cu, Ag, Al, Ce, Tb, Cl, I, Mg, or Mn such as by use of halides (including Cl, Br, I, F) of metallic elements, or sulfides, oxides, or carbonates, or other raw materials which provide the activator element(s) to be present in the final composition. Additionally, it is preferable to add one or more flux materials ($NH_4Cl$, $ZnCl_2$, etc.) to enhance the reaction between the host material, which according to one preferred form of the present invention is $ZnS_xSe_y$ with attendant constraints and features as elsewhere set forth herein, as the use of such fluxes are known to those skilled in the art. After a thorough mechanical mixing using conventional means such as a mortar and pestle, ball mill, grinder, etc., the resulting material is fired at a temperature which is preferably in the range of about 700° C. to about 1300° C. in vacuum or inert atmosphere, to create a luminescent $ZnS_xSe_y$:Cu,A compound. The material resulting from such firing is subsequently cooled, and then cocomminutated before an optional second firing stage at a temperature in the range of about 700° C. to about 1300° C. in vacuum or inert atmosphere, such as in nitrogen or argon, to achieve activation. Close control of the purity of the raw materials and preparation procedures are required to obtain phase purity in these phosphors. The relative amounts of Zn, S, and Se present in the final product are are readily adjustable by one of ordinary skill by adjusting the relative amounts of the raw materials which contain these elements in the raw material mixture.

The manufacturing process is not limited to the one previously described, but different starting materials and synthesis techniques can be used to achieve the same results and compounds. For example, the present invention contemplates the use of a ZnSeS compound as raw starting materials, which can be fired with appropriate activators in a controlled hydrogen sulfide and/or a hydrogen selenide atmosphere. The following examples are illustrative of preferred raw material mixtures, and should not be considered as delimitive of ways in which the compositions of the present invention may be prepared.

EXAMPLE 1

| ZnS | 40 grams |
| ZnSe | 60 grams |
| $AgClO_4$ | 29 milligrams |
| $CuCl_2$ | 47 milligrams |
| $CeCl_3$ | 60 milligrams |
| $ZnCl_2$ | 0.5 grams |

The resulting composition has the formula $ZnS_{0.5}Se_{0.5}$:Cu, Ag,Cl,Ce

EXAMPLE 2

| ZnS | 80 grams |
| ZnSe | 20 grams |
| $AgClO_4$ | 15 milligrams |
| $CuCl_2$ | 23 milligrams |
| $CeCl_3$ | 30 milligrams |
| $TbF_3$ | 26 milligrams |
| $ZnCl_2$ | 0.5 grams |

The resulting composition has the formula $ZnS_{0.86}Se_{0.14}$:Cu,Ag,Cl,Ce,Tb.

A phosphor according to the invention may be produced using mixtures of the ingredients specified in either of examples 1 or 2 above, by combining, slurry-mixing, and subsequently ball-milling in de-ionized water and/or solvent to an average particle size of about one to ten microns. After drying, the mixture is ball-milled or grinded into fine particles and then fired in a quartz crucible at 1000° centigrade for 2 hours in a vacuum. The luminescent material is then removed from the crucible and sifted in a sieve shaker in order to obtain phosphors with the particle size distribution desired.

Figure 4:
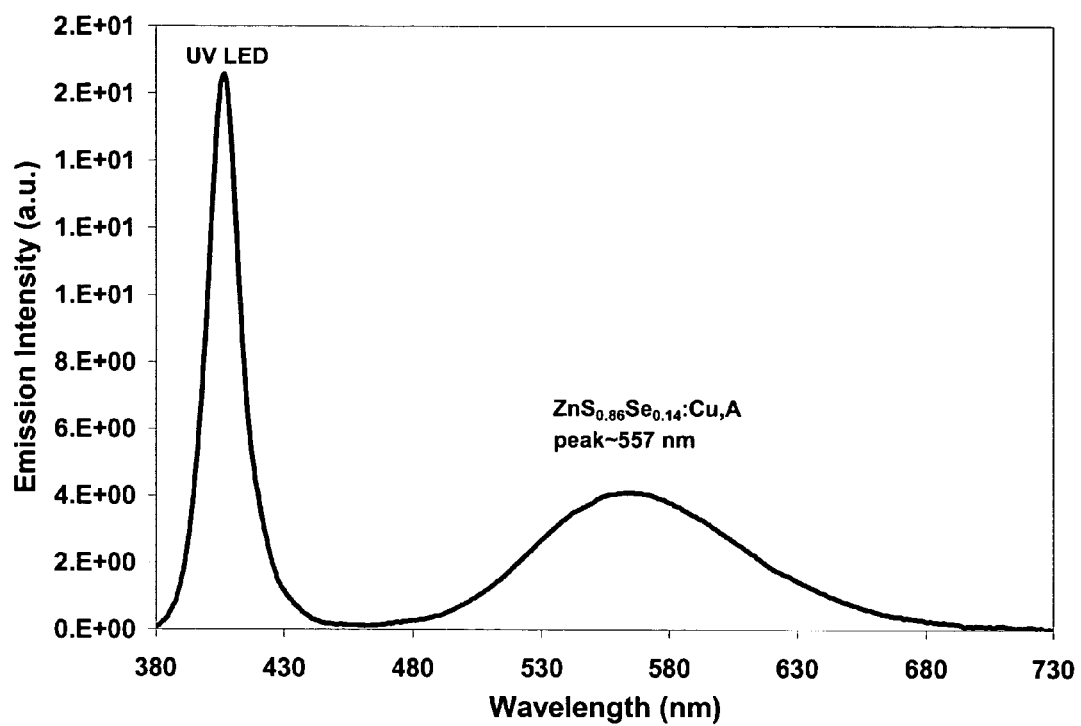
FIG. 4 illustrates the spectrum displayed by a composition of the present invention pumped by an LED operating in the UV range.

In one preferred embodiment of the invention for applications requiring efficient bluish white ("cool white") the present invention provides a green-yellow phosphor comprising $ZnS_xSe_y$:Cu,A in which x=0.86; y=0.14, and A is the combination of Ag, Cl, Ce, and Tb, yielding $ZnS_{0.86}Se_{0.14}$:Cu,Ag,Cl,Ce,Tb. The performance of this phosphor is shown in FIG. 4 which illustrates how one composition of the present invention can be used to efficiently convert part of the emission from a UV LED at 405 nm to yellow-green light around 557 nm, thus yielding a perceived white light emission.

Figure 3:
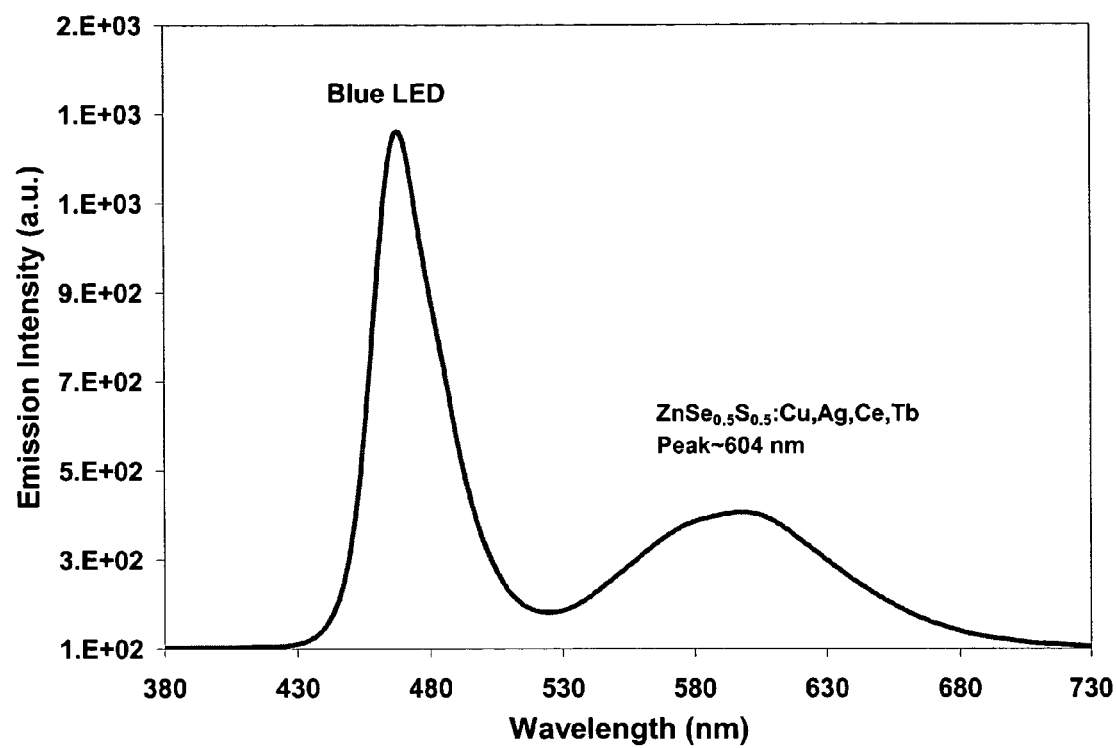
FIG. 3 illustrates the spectrum of one of the novel sulfoselnide phosphor phases pumped by a blue LED.

FIG. 3 illustrates the spectrum displayed by another composition of the present invention, for applications requiring higher red content ("warm white"), $ZnS_{0.4}Se_{0.6}$:Cu,Ag,Cl,Ce,Tb that efficiently converts the emission from a blue LED at 470 nm to orange-yellow light around 604 nm.

Figure 5:
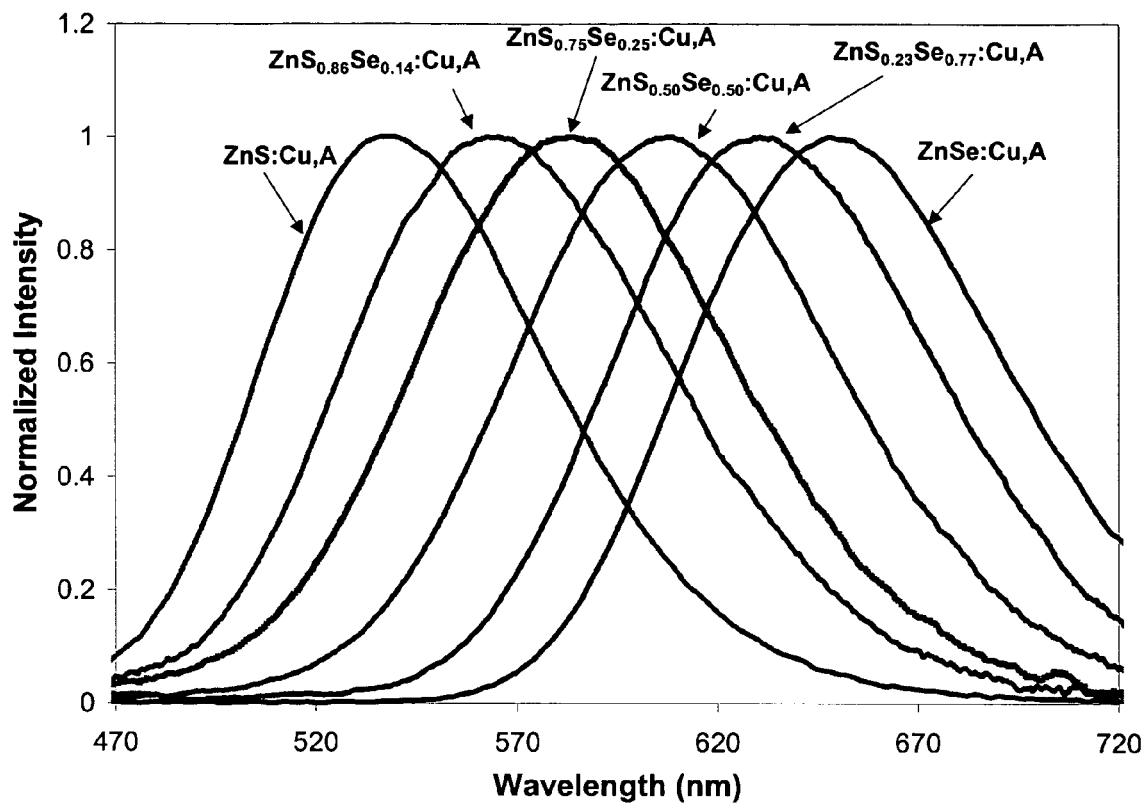
FIG. 5 illustrates the emission spectra of several different compositions of the present invention.

In another preferred embodiment, the present invention provides a yellow phosphor based on $ZnS_xSe_y$:Cu,A in which x=0.50; y=0.50 yielding $ZnS_{0.50}Se_{0.50}$:Cu,A which is an orange luminescent phosphor with peak around 609 nm. The performance of this phosphor is shown in FIG. 5.

In another preferred embodiment, for applications requiring deep red emission, the present invention provides a red luminescent phosphor based on $ZnS_xSe_y$:Cu,A in which x=0.23; y=0.77 yielding $ZnS_{0.23}Se_{0.77}$:Cu,A which has an emission peak around 632 nm. The performance of this phosphor is also shown in FIG. 5.

Thus, the present invention is broad with respect to the numerous possible compositions it affords one desiring of providing a phosphor, and the particular composition chosen by one practicing the invention will depend upon the particular requirements of the needs at hand. As can be seen in FIG. 5, as the selenium content in $ZnS_xSe_y$:Cu,A is increased (e.g., for lower x values and higher y value), the emission from the phosphor shifts from bluish green to red. Also, the absorption peak of the phosphor shifts from the ultraviolet to the blue region. Hence, the present invention is versatile in the number of phosphors possible within its scope. Thus, FIG. 5 illustrates the emission spectra of several different possible compositions of the present invention, according to the formula $ZnS_xSe_y$:Cu,A and which shows the degree of wavelength tunability possible. In each of the absorbance curves in FIG. 5, A represents the activator component, which is Cu,Ag,Cl.

Throughout this specification and the claims appended hereto, ranges are provided in relation to certain variables used to describe relative amounts of elemental constituents present in a composition of the invention in the format of: $0 \leq x \leq 1$. Such format is written with the intent that the reader of this specification and the claims appended hereto shall interpret such a range as including all imaginable and real numerical values between zero and one. As examples, given for the sole purpose of clarity and avoidance of doubt as to the breadth and scope of the meaning of this range within this specification and its claims, the range $0 \leq x \leq 1$ includes, without limitation, the numerical values represented by 0.000001, 0.067, ½, ⅙, 0.3333, 0.75, ⅔, 0.41666666, 0.9999999, 0.99, $100/101$, $\pi/4$, 0.74, 0.73999, 0.7400009, 0.1, 0.2, 0.3, 0.4, 0.5, 0.6, 0.7, 0.8, 0.9, 1, 0.50001, as well as all ranges encompassed by the random or purposeful selection of any two numerical values, each of which individually have a value between 0 and 1. In general, a given numerical value qualifies as being in the range of between $0 \leq x \leq 1$ if the numerical value under consideration yields a number having an absolute value of any number in the range of between $2 \leq x \leq 3$ when the numerical value under consideration is subtracted from 3. Thus, the expression $0 \leq x \leq 1$ inherently includes such ranges as $0 \leq x \leq 0.1$ and $0.001 \leq x \leq 0.79004217$. In cases of ranges which might come to mind such as $0.001 \leq x \leq 0.79004217$ where the number of significant figures present at one end of the ranges is less than the number of significant figures at the other end of the range, the reader is hereby instructed to add an appropriate number of zeros as placeholders to compensate for any discrepancy perceived as blocking their interpretation of mathematical values.

The phrase: "present in any amount between about 0.0001% and about 5% in mole percent based on the total molar weight of said composition" frequently occurs in the present specification and the claims appended hereto. Substitution of this foregoing phrase with "present in any amount between about 0.0001% and about 5% in weight percent based upon the total weight of said composition (or phosphor, as the case may be)" in every occurrence provides further alternative embodiments of the invention.

Consideration must be given to the fact that although this invention has been described and disclosed in relation to certain preferred embodiments, obvious equivalent modifications and alterations thereof (either in view of this specification and its appended claims alone or by combination therewith with one or more teachings of the prior art), will undoubtedly become apparent to one of ordinary skill in this art upon reading and understanding this specification and the claims appended hereto. Accordingly, the presently disclosed invention is intended to cover all such modifications and alterations, and is limited only by the scope of the claims that follow.

What is claimed is:

1. A composition of matter useful as a phosphor in light emitting diodes, which comprises a material described by the formula:

$$ZnS_xSe_y:Cu$$

wherein $0 \leq x \leq 0.5$ and $0 \leq y \leq 0.5$, and subject to the proviso that the sum of x and y is equal to any number in the range of between about 0.75 and about 1, and wherein Cu is present in any amount between about 0.0001% and about 5% in mole percent based on the total molar weight of said composition.

2. A composition of matter which comprises a material described by the formula:

$$ZnS_xSe_y:Cu$$

in which x and y are each independently any value between 0 and 1, subject to the proviso that the sum of x and y is equal to any number in the range of between about 0.75 and about 1.25, and subject to the proviso that x is equal to at least 0.2, and wherein Cu is present in any amount between about 0.0001% and about 5% in mole percent based on the total molar weight of said composition, and according to claim 1 wherein $0.2 \leq x \leq 0.5$ and $0.5 \leq y \leq 1.0$.

3. A composition of matter useful as a phosphor in light emitting diodes, which comprises a material described by the formula:

$$ZnS_xSe_y:Cu,A$$

in which x and y are each independently any value between 0 and about 1, subject to the proviso that the sum of x and y is equal to any number in the range of between about 0.75 and about 1.25; and subject to the proviso that x is not zero, wherein A comprises at least one additional element selected from the group consisting of: Ag, Ce, Tb, Cl, I, Mg, and Mn, including mixtures thereof, and wherein Cu is present in any amount between about 0.0001% and about 5% in mole percent based on the total molar weight of said composition, and wherein $0.001 \leq x \leq 0.5$ and $0 \leq y \leq 0.5$.

4. A composition according to claim 3 wherein the total amount of A present is any amount between about 0.0001% and about 5% in mole percent based on the total molar weight of said composition.

5. A composition of matter useful as a phosphor in light emitting diodes, which comprises a material described by the formula:

$$ZnS_xSe_y:Cu,A$$

in which x and y are each independently any value between 0 and about 1, subject to the proviso that the sum of x and y is equal to any number in the range of between about 0.75 and about 1.25; and subject to the proviso that x is not zero, wherein A comprises at least one additional element selected from the group consisting of: Ag, Ce, Tb, Cl, I, Mg, and Mn, including mixtures thereof, and wherein Cu is present in any amount between about 0.0001% and about 5% in mole percent based on the total molar weight of said composition, and wherein $0.001 \leq x \leq 0.5$ and $0.5 \leq y \leq 1.0$.

6. A composition according to claim 5 wherein the total amount of A present is any amount between about 0.0001% and about 5% in mole percent based on the total molar weight of said composition.

* * * * *